_United States Patent_ [19]

De

[11] Patent Number: 4,866,371

[45] Date of Patent: Sep. 12, 1989

[54] SAMPLE ACCOMMODATOR AND METHOD FOR THE MEASUREMENT OF DIELECTRIC PROPERTIES

[75] Inventor: Bibhas R. De, Laguna Beach, Calif.

[73] Assignee: Chevron Research Company, San Francisco, Calif.

[21] Appl. No.: 252,023

[22] Filed: Sep. 28, 1988

Related U.S. Application Data

[63] Continuation of Ser. No. 907,763, Sep. 15, 1986, abandoned, which is a continuation of Ser. No. 637,376, Aug. 2, 1984, abandoned.

[51] Int. Cl.$^4$ .............................................. G01R 27/04
[52] U.S. Cl. ......................... 324/58.5 R; 324/58.5 A; 324/58.5 B; 324/347
[58] Field of Search ................... 324/347, 58 A, 58 B, 324/58 C, 58 R, 58.5 A, 58.5 B, 58.5 C, 58.5 R

[56] References Cited

U.S. PATENT DOCUMENTS

| | | | |
|---|---|---|---|
| 3,136,946 | 6/1964 | Levine | 324/58.5 A |
| 3,510,764 | 5/1970 | Heath | 324/58.5 C |
| 3,572,119 | 3/1971 | Bak | 324/58.5 B |
| 3,599,120 | 8/1971 | Thibault | 324/58.5 C |
| 3,693,080 | 9/1972 | Ross | 324/58.5 A |
| 3,695,107 | 10/1972 | Hertz | 324/58.5 B |
| 3,715,667 | 2/1973 | Nicolson | 324/58.5 B |
| 3,812,422 | 5/1974 | DeCarolis | 324/58.5 B |
| 3,825,861 | 7/1974 | O'Donnell | 333/33 |
| 3,853,005 | 12/1974 | Schendel | 324/58.5 B |
| 3,942,107 | 3/1976 | Gerhard | 324/58 B |
| 3,965,416 | 6/1976 | Friedman | 324/58.5 B |
| 3,995,212 | 11/1976 | Ross | 324/58.5 B |
| 4,123,703 | 10/1978 | Robinson | 324/58.5 B |
| 4,361,801 | 11/1982 | Meyer | 324/58.5 R |
| 4,520,308 | 5/1985 | Rohde | 324/58.5 R |
| 4,651,085 | 3/1987 | Sakurai | 324/58.5 C |
| 4,755,743 | 7/1988 | Jakkula | 324/58.5 B |

FOREIGN PATENT DOCUMENTS 3150202 6/1983 Fed. Rep. of Germany ..... 324/58.5 C

Primary Examiner—Reinhard J. Eisenzopf
Assistant Examiner—Jose M. Solis
Attorney, Agent, or Firm—E. J. Keeling; E. A. Schaal

[57] ABSTRACT

A sample accommodator for the measurement of dielectric properties includes a conductive strip having two planar surfaces, and two ground planes, one parallel to each of the planar surfaces of the conductive strip. At each end, the strip passes through but is electrically isolated from an endplate which is electrically and physically connected to each ground plane and which maintains the relative positions of the ground planes. Dielectric properties are measured by placing a sample between each face of the strip and the ground plane parallel to it.

13 Claims, 6 Drawing Sheets

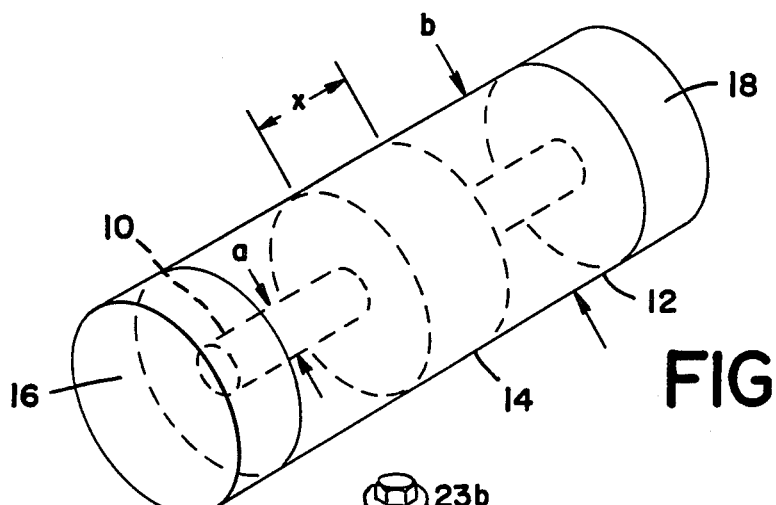
FIG_1
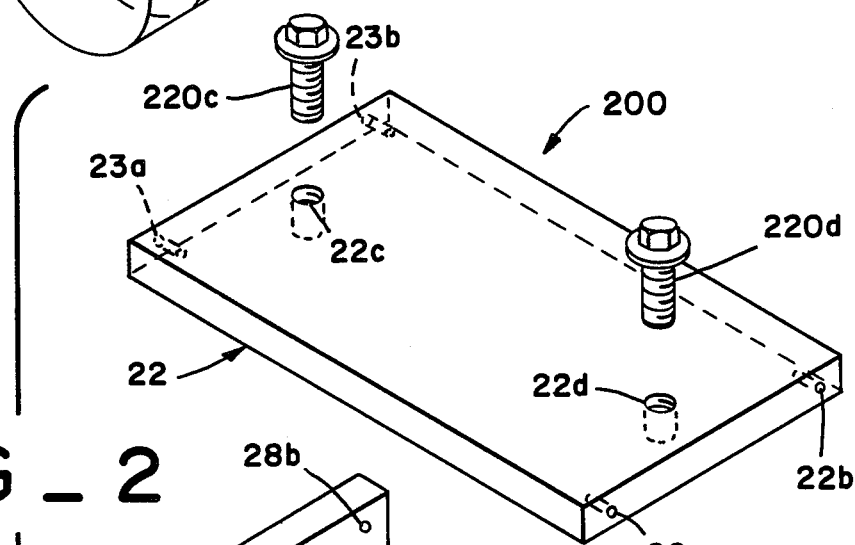
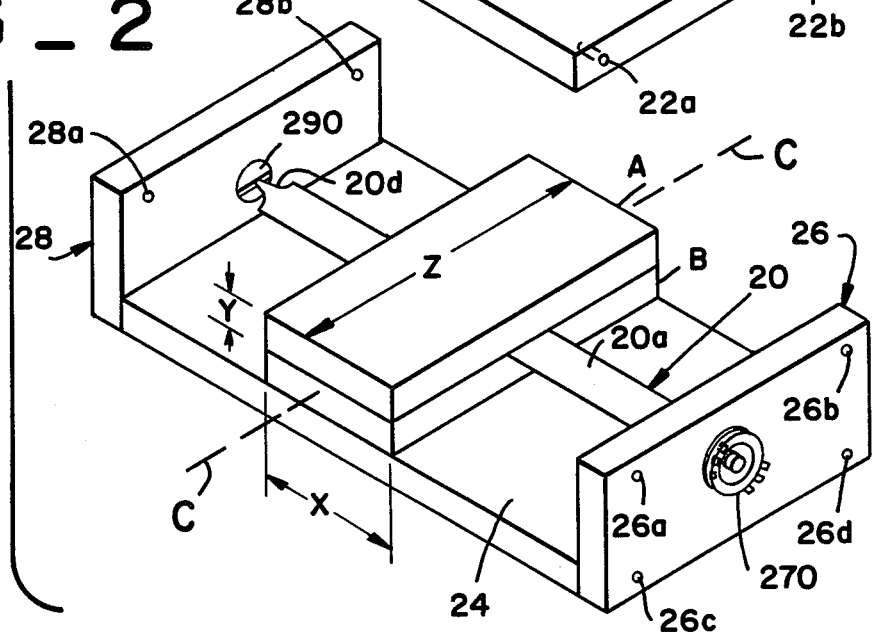
FIG_2

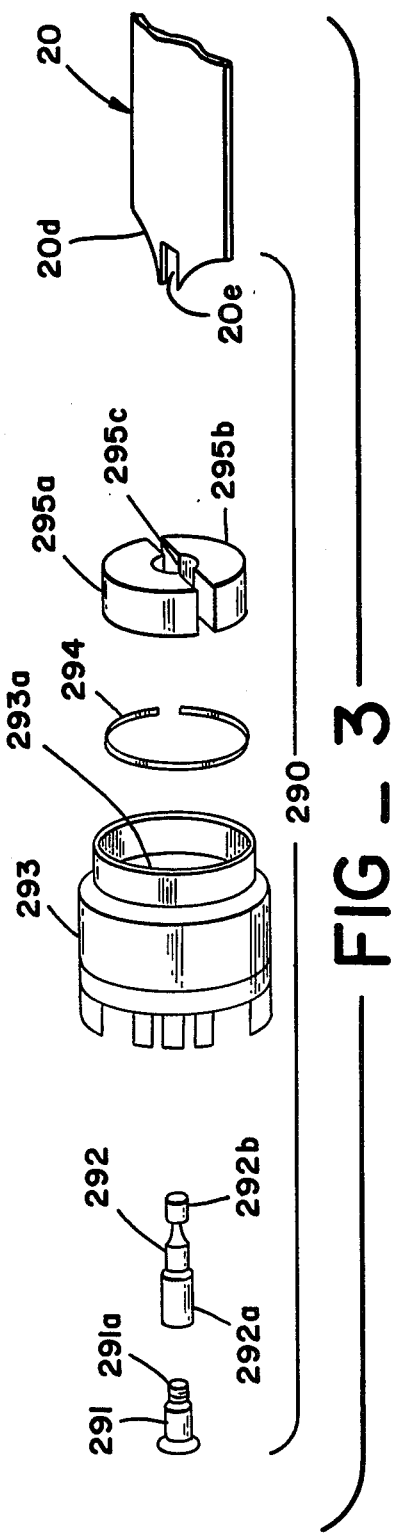
FIG_3
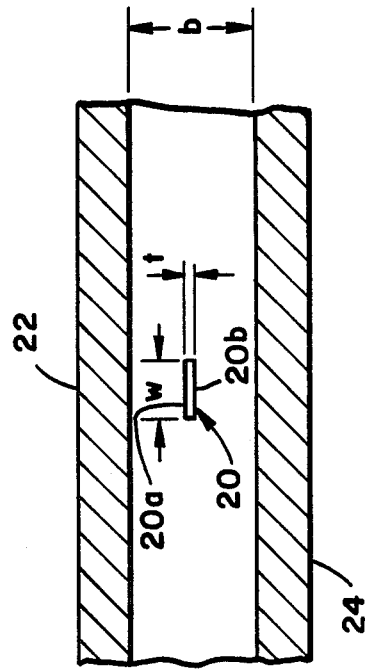
FIG_5
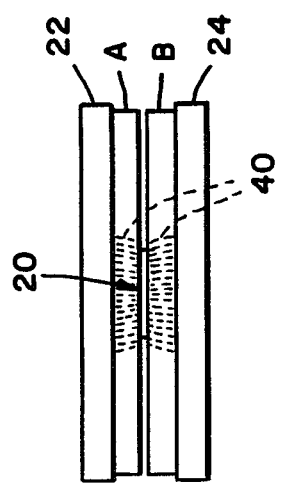
FIG_4

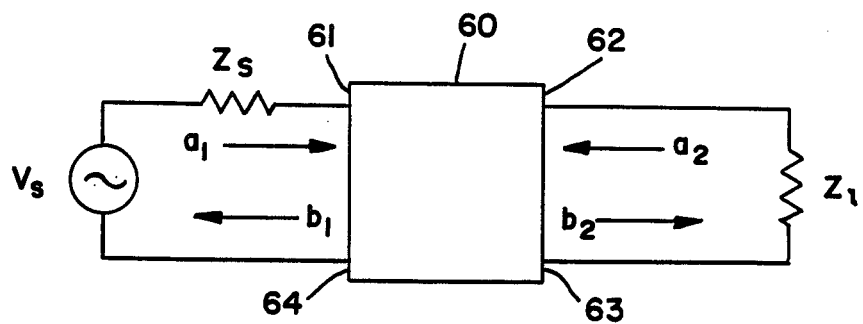
FIG _ 6
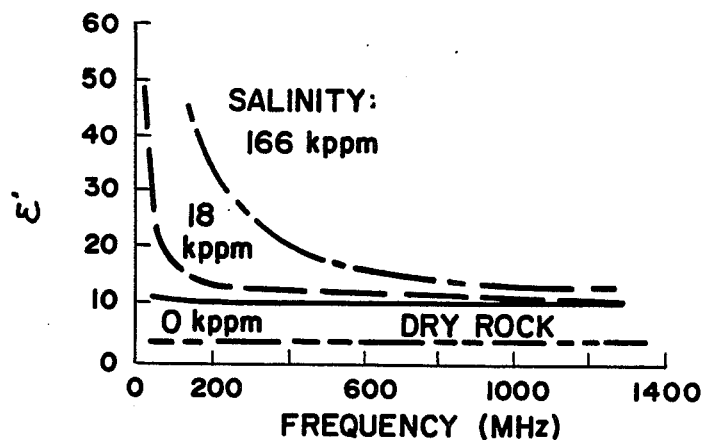
FIG _ 10A
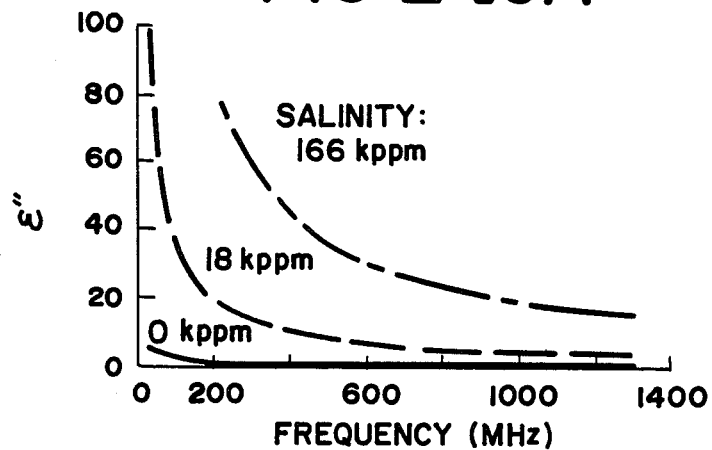
FIG _ 10B

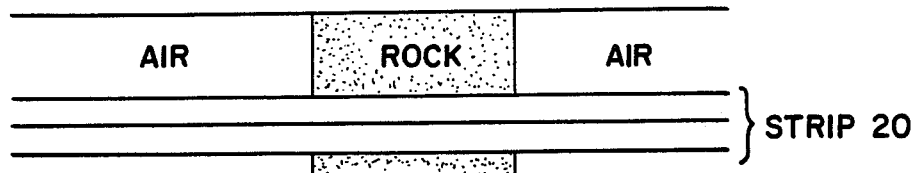
FIG _ 7A
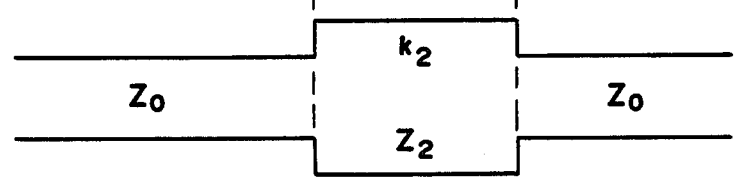
FIG _ 7B
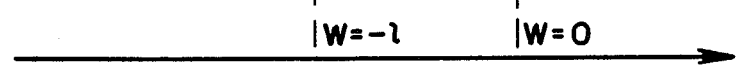
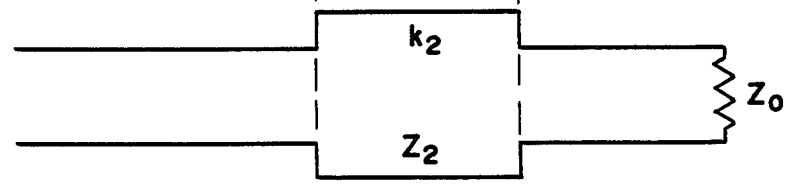
FIG _ 7C
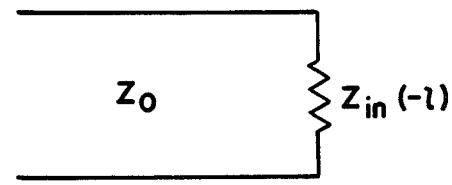
FIG _ 7D

FIG_8
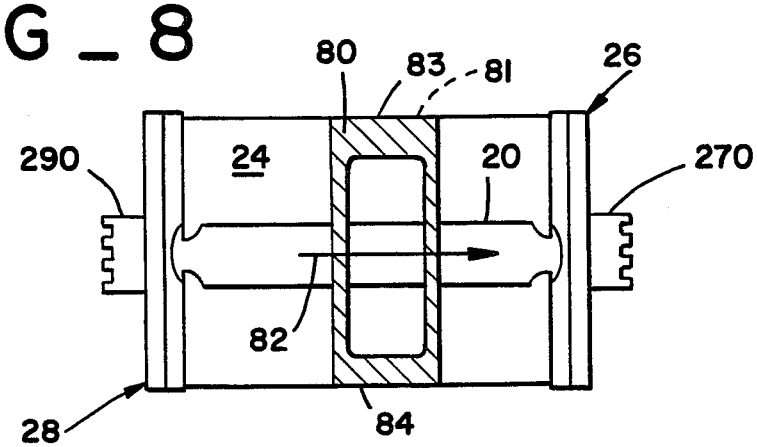
FIG_9A
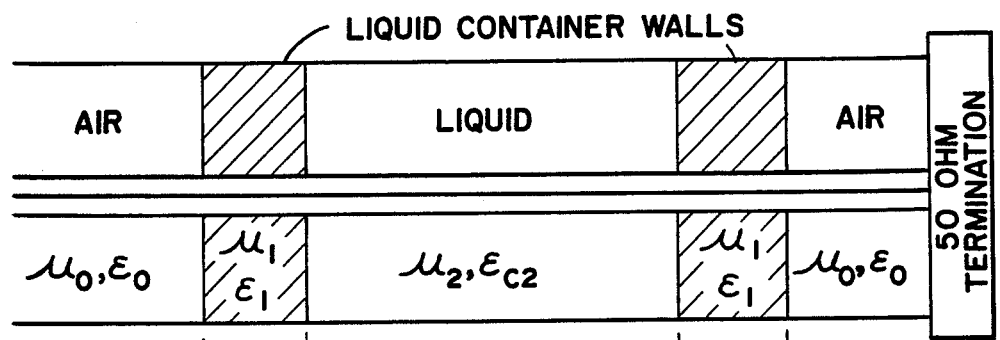
FIG_9B
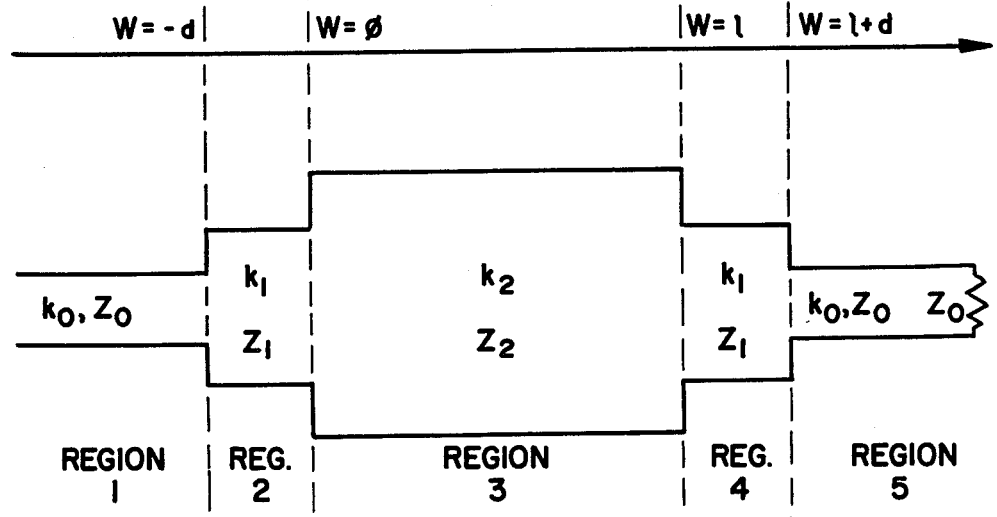

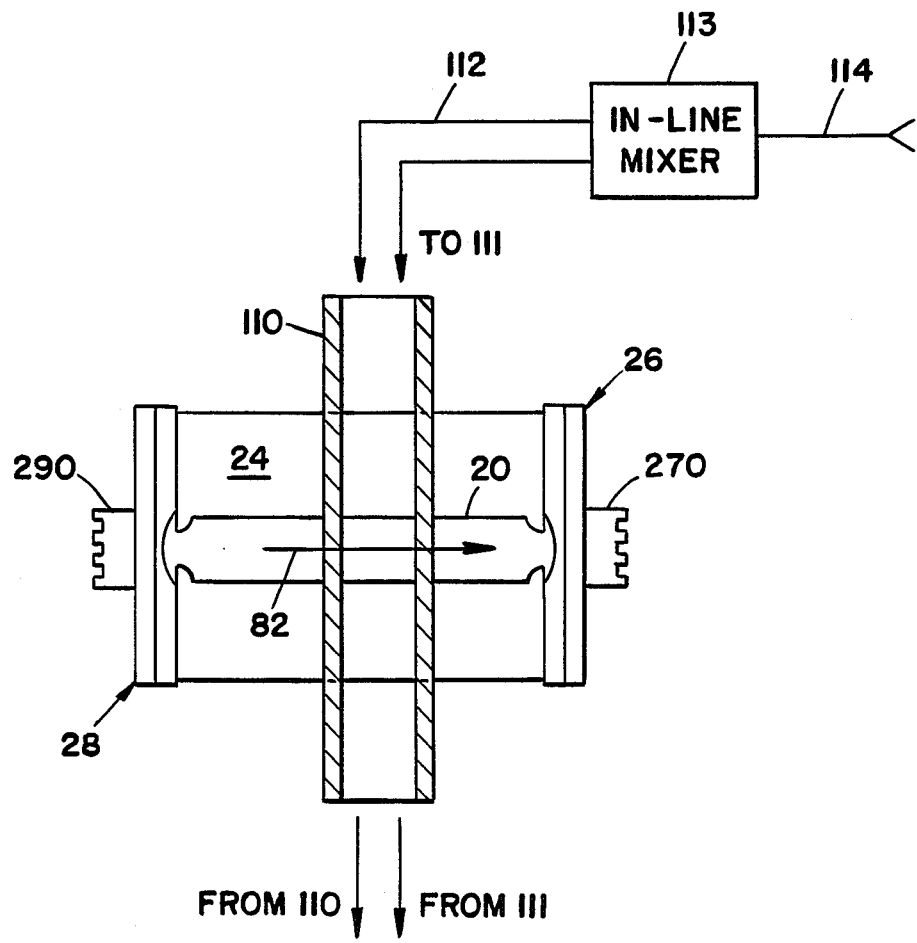
FIG_11

SAMPLE ACCOMMODATOR AND METHOD FOR THE MEASUREMENT OF DIELECTRIC PROPERTIES

This application is a continuation of application Ser. No. 907,763, filed Sept. 15, 1986, abandoned, which application is, in turn, a continuation of application Ser. No. 637,376, filed Aug. 2, 1984 and now abandoned.

BACKGROUND OF THE INVENTION

The present invention relates in general to methods and apparatus for the measurement of dielectric properties and in particular to methods and apparatus for the measurement of dielectric properties of core samples encountered in petroleum exploration.

The recent advent of a dielectric well logging technique in petroleum exploration has necessitated laboratory measurement of the dielectric permittivity of core samples in the same way that resistivity and induction logging techniques necessitated laboratory measurement of the conductivity of core samples. Known techniques of laboratory dielectric permittivity measurements in the VHF (30–300 MHz) and the UHF (300–1000 MHz) ranges (roughly covering the 20–1100 MHz range of frequencies of interest in dielectric well logging) require solid samples to be precision-machined to fit sample accommodators having precise dimensions. However, may types of core samples do not readily lend themselves to such machining.

SUMMARY OF THE INVENTION

Accordingly, apparatus according to the present invention involves a sample accommodator (i.e. a holder for the sample) for the measurement of dielectric properties. The accommodator comprises two ground planes, each of which is positioned opposite to and parallel with a different one of two surfaces of a conductive strip.

A method of measuring dielectric properties according to the present invention includes placing each of two sample portions between a different planar surface of a conductive strip and one of two ground planes. The scattering parameters of the sample portions are then measured either in the frequency domain or in the time domain. These parameters are then used to compute the real and imaginary parts of the complex dielectric constant, which represent the dielectric constant and the resistivity (or conductivity) of the sample, over a broad range of frequencies.

BRIEF DESCRIPTION OF THE DRAWINGS

FIG. 1 is a perspective view of a prior art sample accommodator shown partially in phantom;

FIG. 2 is an exploded view of a sample accommodator according to the present invention;

FIG. 3 is an exploded view of a transition for connection of a coaxial cable to a center strip according to the present invention;

FIG. 4 is a cross-sectional view along line C of FIG. 2 through a sample accommodator containing a sample according to the present invention;

FIG. 5 is a cross-sectional view along line C of FIG. 2 through an empty sample accommodator according to the present invention;

FIG. 6 is a two-port network diagram of the sample accommodator of FIG. 2;

FIGS. 7A–7D show a schematic, transmission line representation of the sample accommodator of FIG. 2;

FIG. 8 is a view in top plan of a sample accommodator having compartments for liquid sample containment according to the present invention;

FIGS. 9A and 9B show a schematic transmission line representation the sample accommodator of FIG. 8;

FIGS. 10A and 10B are a set of curves showing real and imaginary parts of the dielectric constant as measured by the apparatus according to the present invention; and FIG. 11 is a view in top plan of an alternative embodiment of the sample accommodator of FIG. 8 for monitoring the dielectric constant of a constantly flowing fluid.

DESCRIPTION OF THE PREFERRED EMBODIMENTS

Of the techniques currently available for the measurement of machinable dielectric samples, the one that has found the widest application in the oil industry is the coaxial sample accommodator technique.

As illustrated in FIG. 1, a coaxial sample accommodator according to the prior art requires a sample 14 to be machined in the form of an annular cylinder which has to conform to very precise dimensions and concentricity. While such requirements are not difficult to satisfy in the case of standard dielectrics, such as plexiglass and the sort of fluorine-containing resiuns sold under the trademark Teflon, or, with some effort, in the case of well-consolidated rocks of low porosity and homogeneous constitution, it is very hard to satisfy these requirements for the large majority of core sample varieties commonly encountered in the oil industry. Furthermore, it has been shown that when deviations from an ideal annular cylindrical shape occurs, it is necessary to apply large corrections to measured data.

Coaxial sample accommodators have an inner conductor 10 with a diameter a and an outer conductor 12 with a diameter b, as shown in FIG. 1. Sample 14, having an axial dimension X, is coaxial with conductors 10 and 12. Conductors 10 and 12 are connected at either end to a first connector 16 and a second connector 18.

The coaxial sample accommodators currently in use derive their a and b dimensions from the standard 50-ohm connectors available in the market. Commonly, connectors are of the APC-7 and GR-900 types for which the b dimensions are 7 mm and 14 mm, respectively. These small dimensions make machining very difficult, and accentuate any errors in dimension.

However, even when the b dimension is increased to as much as 20.65 mm, close to the largest practical size at which undesirable wave propagation modes may be avoided, the concentricity requirement (the coincidence of the axes of the inner and the outer cylindrical surfaces) is very hard to satisfy for most samples of interest. This requirement for concentricity is easier to achieve for short sample lengths (in the axial direction), but shorter lengths introduce larger errors in the measurements of dielectric properties, and make the measurements uncertain at relatively lower frequencies.

FIG. 2 illustrates a sample accommodator 200 according to the present invention. A conductive strip 20, having flat surfaces 20a and 20b (not shown), is suspended between a first ground plane 22, and a second ground plane 24. Although shown in an exploded view in FIG. 2, when sample accommodator 200 is closed around a sample, ground plane 22 is parallel to and opposite to surface 20a, as indicated in FIG. 4. Ground plane 24 is parallel to and opposite to surface 20b (not shown).

Strip 20 has a first fluted end 20c (not shown) which forms a part of a first transition 270. Strip 20 also has a second fluted end 20d which forms a part of a second transition 290.

Two sample portions, in the form of blocks A and B, are placed in sample accommodator 200. Each sample block is machined to approximate a rectangular prism. Each has a length dimension X parallel to a long dimension of strip 20. Each has a width dimension Z perpendicular to the long dimension of strip 20 and approximately coextensive with a dimension of ground plane 24 which dimension is perpendicular to the long dimension of strip 20. Finally, each block has a depth dimension Y normal to flat surfaces 20a and 20b.

In order to contain samples A and B within sample accommodator 200, each ground plane is attached to a first end plate 28 at a first end and to a second end plate 26 at a second end. This attachment is accomplished by tightening a screw (not shown) through a hole 28a in end plate 28 and into threaded hole 23a and in ground plane 22, respectively. Screws (not shown) are also tightened through the corresponding pairs of holes 28a and 23b; 26a and 22a; 26b and 22b; 26c and 24c (not shown); 26d and 24d (not shown) 28c (not shown) and 25c (not shown); and 28d and 25d (not shown).

Threads on the outer casing of each of two tuning screws 220c and 220d are respectively engaged with threads in two holes 22c and 22d above opposite ends of strip 20. Likewise, below opposite ends of ground plane 24, threads on tuning screws 240c (not shown) and 240d (not shown) are engaged with threads in holes 24c (not shown) and 24d (not shown).

End plate 26 has a central, round aperture aligned with strip 20 and into which a part of first transition 270 is fitted. Similarly, end plate 28 has a central, round aperture aligned with strip 20 and into which a part of second transition 290 is fitted.

As shown in FIG. 3, wherein structures also found in FIG. 2 are identified by the reference numerals used to identify them therein, each transition, exemplified by transition 290, includes a center conductor contact 291 which has a male threaded end 291a for screwing into a female threaded end 292a of a connector center conductor 292.

Each fluted end of strip 20 has two projections forming a notch, such as notch 20e in fluted end 20d. A male end of center conductor 292b is soldered to fluted end 20d within notch 20e. The two projections of fluted end 20d are placed between the ends of two opposing semicylindrical, notched fillers 295a and 295b. The ends of fillers 295a and 295b fit together around the projections of strip 20 so that the combined notches of fillers 295a and 295b form a cylindrical aperture 295c aligned with notch 20e.

The combination of fillers 295a and 295b and fluted end 20d is inserted within the aperture in end plate 28. A retaining ring 294 is placed around fillers 295a and 295b. A central cylindrical aperture in a cylindrical dielectric 293a is passed over end 292a so that connector 293 may be fitted into the aperture in end plate 28. Ring 294 is held in place by gluing it to an inner surface of connector 293 using a suitable glue such as the one sold under the trademark Locktite. Conductor contact end 291a is tightened into female end 292a of center conductor 292 to complete assembly of transition 290.

The same steps are performed to assemble the same sorts of components into transition 270.

Ground planes 22 and 24 and end plates 26 and 28 may be readily machined out of aluminum blocks commonly available to those skilled in the art. Connector parts suitable for use as elements 291, 292, 293 and 294 are available as an MPC 14 (GR-900) connector, part number 2480A, from Maury Microwave Corporation, Cucamonga, California. The gradual "flute" expansion at ends 20c and 20d brings center strip 20 from the dimension of the inner conductor of the GR-900 connector to its full width w. Center strip 20 may be fabricated out of 0.0024 inch-thick brass sheet readily available to those skilled in the art. For example, a strip constructed for a sample accommodator according to the present invention has an impedance of 50 ohms when empty and has a separation between ground planes of 0.6221 in. Fluted portions 20c and 20d of radius 0.375 in. extend for 0.276 in. at either end of strip 20 has a total length of 0.399 inches, a width of 0.847 in. and having a 0.197 inch deep notch at either end L/S band tuning screws suitable for use as elements 220c, 220d, 240c and 240d may be obtained under part number JMC P/N 6965-0 from the Johanson Manufacturing Company, Boonton, NJ. These screws are adjusted to obtain a desired impedance characteristic over a desired frequency band when the sample accommodator is empty.

Filers 295a and 295b are readily fabricated out of any of a number of fluorine-containing resins, such as those sold under the trademark Teflon, for example. In the case of a 50 ohms stripline, the dielectric constant of the material is approximately 2.

The separation between ground planes 22 and 24 may be chosen to equal the inside diameter of the outer conductor of an unassembled commercial GR-900 rigid line connector, so as to obtain a good electrical match between transitions 270 and 290 and strip 20. Strip 20 is chosen to be paper thin (i.e., $t < < w$), in order to eliminate one dimension from the calculations. The strip width w may be chosen to obtain a 50-ohm characteristic impedance for the empty sample accommodator. After calculating the theoretical value of w, a trial-and-error technique may be used to trim this width in order to fine-adjust the impedance.

As shown in FIG. 2, samples A and B are cut in the form of bars of rectangular cross-section. Two such bars are used for each sample. They fit in the sample accommodator in the way shown in FIG. 2. The X-dimension of each bar enters into the calculations. Thus, it is desirable that the X-dimension be as nearly the same for the two bars as possible. The actual value of this dimension is not critical, as long as it is known accurately. For each bar the y-dimension, corresponding to the separation between each ground plane and an opposing surface of strip 20, has to be such that the sample fits snugly in the accommodator. The z-dimension of the sample accommodator, is somewhat arbitrary, but it is important that this dimension be large enough so that fringing fields 40, as shown in FIG. 4, are contained within the sample blocks. In FIG. 4, structures also found in FIG. 2 are identified by the reference numerals used to identify them therein.

As shown in the partial cross-section of FIG. 5, wherein structures also found in FIG. 2 are identified by the reference numerals used to identify them therein, an empty sample accommodator according to the present invention is in the form of a transmission line, where the central conductor is a metallic strip 20, sandwiched between two conducting planes 22 and 24. A dielectric material may be placed between each surface of strip 20 and the plane opposite to it. Assuming that the width w of strip 20 is large enough so that the fringing fields at the edges of strip 20 do not interact, the characteristic impedance $Z_0$ a dielectric-filled line is:

$$Z_0 = \frac{94.15}{\frac{w/b}{1 - (t/b)} + \frac{C_f}{0.0885 \, \epsilon_r}} \frac{1}{\sqrt{\epsilon_r}} \text{ ohms} \quad (1)$$

where the capacitance $C_f$ due to fringing fields is given by $$C_f = \frac{0.0885 \, \epsilon_r}{\pi} \left\{ \left[ \frac{2}{1 - (t/b)} \right] \ln \left[ \frac{1}{1 - (t/b)} + 1 \right] - \left[ \frac{1}{1 - (t/b)} \right] - 1 \ln \left[ \frac{1}{1 - (t/b)^2} - 1 \right] \right\} \quad (2)$$

in picofarad/cm and where:
$\epsilon_r$ = the permittivity of the dielectric;
w = the width of strip 20;
t = the thickness of strip 20; and
b = the distance between planes 22 and 24.

Dielectric constants are obtained according to the method of the present invention from measurements of scattering parameters of a sample by connecting transitions 270 and 290 to ports of an appropriate apparatus. In the frequency domain measurements may be made by using a network analyzer, such as the Model 8505A Automatic Network Analyzer System 300 available from Hewlett-Packard, Inc., Palo Alto, CA. In the time-domain a waveform processing system, such as the Model 7854/7S12 Time-Domain Reflectometer available from Tektronix, Inc., Beaverton, Oregon, may be used to make measurements with various pulses generator/sampler combinations. Either technique measures the S parameters (scattering parameters) $S_{11}$ and $S_{21}$ (or, equivalently, $S_{22}$ and $S_{12}$). These are complex quantities giving the amplitudes and phases of the signals reflected from and transmitted through the sample, respectively. From these parameters, the complex dielectric permittivity (as well as the magnetic permeability) of the sample can be calculated, given the width of the sample in the direction of propagation which corresponds to the X-dimension in FIG. 2.

The network formed by the sample accommodator and attached measurement apparatus may be diagrammed as shown in FIG. 6.

The two-port network illustrated in FIG. 6 may be described by the following equations:

$$b_1 = S_{11} a_1 + S_{12} a_2 \quad (3)$$

$$b_2 = S_{21} a_1 + S_{22} a_2 \quad (4)$$

where:
$a_1$ = a voltage measured across source impedance $Z_s$ looking into a two-port network 60 at 61;
$a_2$ = a voltage measured across a impedance $Z_l$ looking into network 60 at 62;
$b_1$ = a source voltage measured looking out of network 60 at 64; and $b_2$ = a voltage measured looking out of network 60 at 63 and where $S_{11}$, $S_{22}$, $S_{12}$, and $S_{21}$ are the S parameters (scattering parameters) which are defined as follows:

$$S_{11} = \frac{b_1}{a_1} \bigg|_{a_2=0} \quad (5)$$

= an input reflection coefficient with the output port terminated in a matched load ($Z_L = Z_0$ sets $a_2 = 0$);

$$s_{22} = \frac{b_2}{a_2} \bigg|_{a_1=0} \quad (6)$$

= an output reflection coefficient with the input port terminated in a matched load ($Z_s = Z_0$ and $V_s = 0$ set $a_1 = 0$ where $V_s$ is a source voltage);

$$S_{21} = \frac{b_2}{a_1} \bigg|_{a_2=0} \quad (7)$$

= a forward transmission gain with the output port terminated in a matched load; and $$S_{12} = \frac{b_1}{a_2} \bigg|_{a_1=0} \quad (8)$$

= a reverse transmission gain with the input port terminated in a matched load.

FIG. 7A shows a diagrammatic, edge-on view of two rectangular slabs of rock inserted into a strip transmission line. The equivalent transmission line model of this view is shown in FIG. 7B. FIG. 7C depicts the transmission line terminated in a matched load and FIG. 7D is an equivalent circuit for the circuit in FIG. 7C. An air region has a magnetic permeability $\mu_o$ and electric permittivity $\epsilon_o$ while a rock region has a permeability $\mu_2$ and a permittivity $\epsilon_{c2}$. This permittivity is a complex quantity defined by $$\epsilon_{c2} = \epsilon_0 \left( \epsilon_{r2} - j \frac{\sigma_2}{\omega \epsilon_0} \right) \quad (9)$$

where:
$\epsilon_{r2}$ = the relative dielectric constant of a rock sample,
$\sigma_2$ = the conductivity of the rock sample, and
$\omega$ = the angular frequency of an electromagnetic wave propagating through the line.

In the equivalent transmission line model of FIG. 7B, $Z_o$ and $Z_2$ are the impedances of the air portion and rock-filled portions of the line, respectively, and $k_2$ the propagation constant. These quantities are defined as follows:

$$Z_0 = \sqrt{\mu_0} \left[ \frac{83,988}{\frac{w/b}{1 - (t/b)} + \frac{C_f}{0.0885}} \right] \text{ohms}; \quad (10)$$

$$Z_2 = \frac{\sqrt{\mu_2 \epsilon_0}}{\epsilon_{c2}} \left[ \frac{83,988}{\frac{w/b}{1 - (t/b)} + \frac{C_f \epsilon_0}{0.0885 \, \epsilon_{r2}}} \right] \text{ohms; and} \quad (11)$$

-continued $$k_2 = \omega \sqrt{\mu_2 \epsilon_{c2}} \tag{12}$$

where:
$\epsilon_{c2}$ = the permittivity of the sample;
$C_f$ = the fringe capacitance given by $$C_f = \frac{0.0885\,\epsilon}{\pi\epsilon_0} \left\{ \frac{2}{1-(t/b)} \ln\left[\frac{1}{1-(t/b)} + 1\right] - \frac{1}{t-(t/b)} - 1 \ln\left[\frac{1}{1-(t/b)^2} - 1\right] \right\} \tag{13}$$

in picofarads/cm;
$\epsilon$ = the permittivity of the medium in the stripline sample accommodator, either $\epsilon_o$ for the $Z_o$ portion or $\epsilon_o \epsilon_{r2}$ for the $Z_2$ portion; and
where all other constants and variables are as defined above.

For a two-port network we need only consider the input reflection coefficient, $S_{11}$, and the forward transmission gain, $S_{21}$ (or, alternatively, $S_{12}$ and $S_{22}$). Since they are defined with the output terminated in a matched load, we consider the case illustrated in FIG. 7C where the input impedance $Z_{in}(W)$ between $W = -1$ and $W = 0$ is given by $$Z_{in}(W) = \frac{1 + R_{20}e^{j2k_2W}}{1 - R_{20}e^{j2k_2W}} \tag{14}$$

where $$R_{20} = \frac{Z_0 - Z_2}{Z_0 + Z_2}, \tag{15}$$

which is the reflection coefficient of the line at $W = 0$.
$W$ = the distance from the edge at which an incident wave leaves the sample in the direction of propagation (as indicated by the arrow in FIG. 7B);
$l$ = the length of the path through the sample in the direction of propagation; and
where all other constants and variables are as defined above.

Using the definition of $S_{11}$ in Equation (5), the model in FIG. 7C can be simplified to that shown in FIG. 7D so that the expression for $S_{11}$ becomes $$S_{11} = \frac{Z_{in}(-l) - Z_0}{Z_{in}(-l) + Z_0} \tag{16}$$

where all constants and variables are as defined above.
Inserting Equation (14) into equation (16) with $W = -1$ gives $$S_{11} = \frac{R_{02} + R_{20}e^{-j2k_2l}}{1 + R_{02}R_{20}e^{-j2k_2l}} \tag{17}$$

where $$R_{02} = \frac{Z_2 - Z_0}{Z_2 + Z_0}; \text{ and} \tag{18}$$

where all other constants and variables are as defined above.

If the incident wave has an amplitude of unity and its phase at $W = -1$ is zero, then from FIG. 7C, the voltage $V_1$ between $W = -1$ and $W = -\infty$ is $$V_1(W) = e^{-jk_o(W+l)} + S_{11}e^{jk_o(W+l)} \tag{19}$$

and the voltage $V_2$ between $W = 0$ and $W = -1$ is $$V_2(W) = V^+ e_{-jk_2}{}^W + V^- e^{jk_2 W} \tag{20}$$

where all constants and variables are as defined above.
Upon satisfying the boundary condition at $W = -1$, $V_1(-1) = V_2(-1)$ we have $$1 + S_{11} = V^+ e^{jk_2 l}(1 + R_{20}e^{-jk_2 l}) \tag{21}$$

where $$R_{20} = V^-/V^+, \tag{b 22}$$

where $$V^+ = \frac{(1 + S_{11})e^{-jk_2 l}}{1 + R_{20}e^{-jk_2 l}}, \text{ and} \tag{23}$$

where all constants and variables are as defined above.
From the definition of $S_{21}$, $$S_{21} = \frac{V_2(0)}{1} = V^+ + V^- = V^+(1 + R_{20}). \tag{24}$$

The "1" in the denominator represents the unit amplitude and zero phase of the incident wave and $V_2(O)$ is the voltage measured at $W = 0$. All other constants and variables are as defined above. Now we substituted Equations (22) and (23) into Equation (24) and obtain $$S_{21} = \frac{(1 + S_{11})e^{-jk_2 l}(1 + R_{20})}{1 + R_{20}e^{-jk_2 l}}. \tag{25}$$

combining Equation (17) with Equation (25) yields $$S_{21} = \frac{(1 - R_{02}^2)e^{-jk_2 l}}{1 - R_{02}^2 e^{-j2k_2 l}}. \tag{26}$$

We can simplify this expression by letting $$q = e^{-jk_2 l}, \text{ and} \tag{27}$$

$$R = R_{02} = -R_{20} = \frac{Z_2 - Z_0}{Z_2 + Z_0}. \tag{28}$$

Consequently, Equations (17) and (26) may be rewritten as $$S_{11} = \frac{R(1 - q^2)}{1 - R^2 q^2} \tag{29}$$

and $$S_{21} = \frac{(1 - R^2)q}{1 - R^2 q^2}. \tag{30}$$

Adding Equations (29) and (30) we obtain $$S_{11} + S_{21} = \frac{R + q}{1 + Rq} \quad (31)$$

Solving for q gives $$q = \frac{(S_{11} + S_{21}) - R}{1 - (S_{11} + S_{21})R} \quad (32)$$

Equations (29) and (30) also give $$S_{11} + S_{21} + 1 = \frac{(1 + R)(1 + q)}{1 + Rq} \quad (33)$$

$$S_{11} + S_{21} - 1 = \frac{(R - 1)(1 - q)}{1 + Rq} \quad (34)$$

$$S_{11} - S_{21} + 1 = \frac{(1 + R)(1 - q)}{1 - Rq} \quad (35)$$

$$S_{11} - S_{21} - 1 = \frac{(R - 1)(1 + q)}{1 - Rq} \quad (36)$$

which are used to write $$\left[\frac{S_{11} + S_{21} + 1}{S_{11} + S_{21} - 1}\right]\left[\frac{S_{11} - S_{21} + 1}{S_{11} - S_{21} - 1}\right] = \frac{1 + 2R + R^2}{1 - 2R + R^2} \quad (37)$$

or, $$S_{11}R^2 - (S_{11}^2 - S_{21}^2 + 1)R + S_{11} = 0. \quad (38)$$

Solving for R we have $$R = \frac{(S_{11}^2 - S_{21}^2 + 1) - A}{2S_{11}} \quad (39)$$

where
$$A = [(S_{11} + S_{21} + 1)(S_{11} + S_{21} - 1) (S_{11} - S_{21} + 1)(S_{11} - S_{21} - 1)]^{\frac{1}{2}} \quad (40)$$

and where all other constants and variables are as defined above.

The quantity q is obtained by substituting Equation ($\rightleftarrows$) into Equation (34) such that $$q = \frac{(S_{21}^2 - S_{11}^2 + 1) - A}{2S_{21}}. \quad (41)$$

Using Equation (27) we have $$k_2 = \frac{j\ln(q)}{l} \quad (42)$$

and from Equation (28) we have $$Z_2 = Z_0 \frac{1 + R}{1 - R}. \quad (43)$$

If we recall that $k_2 = \omega\sqrt{\mu_2\epsilon_{c2}}$, we can use Equation (40) to write $$\sqrt{\mu_2\epsilon_c^2} = \frac{j\ln(q)}{\omega l}. \quad (44)$$

Substituting Equations (10) and (11) into Equation (43) gives $$\sqrt{\frac{\epsilon_{c2}}{\mu_2}} = \sqrt{\frac{\epsilon_0}{\mu_0}} \frac{1 - R}{1 + R}. \quad (45)$$

The complex permittivity of the rock, $\epsilon_{c2}$, is found from Equations (44) and (45) to be $$\epsilon_{c2} = \left(\sqrt{\frac{\epsilon_0}{\mu_0}}\left(\frac{1}{\omega l}\right)j\ln(q)\left[\frac{1 - R}{1 + R}\right]\right) \quad (46)$$

where R and q are complex numbers. Comparison of this result with Equation 9 gives:

$$\epsilon_{r2} = \frac{1}{\sqrt{\mu_0\epsilon_0}} \frac{1}{\omega l} Re\left[j\ln(q)\left(\frac{1 - R}{1 + R}\right)\right], \text{ and} \quad (47)$$

$$\sigma_2 = -\sqrt{\frac{\epsilon_0}{\mu}} \frac{1}{l} Im\left[j\ln(q)\left(\frac{1 - R}{1 + R}\right)\right]. \quad (48)$$

Thus, q and R are determined from the S parameters using Equations (39) and (41), and the dielectric constant and conductivity are calculated from Equations (47) and (48).

As illustrated in FIG. 8, for measurement of liquid samples, hollow compartments 80 and 81 may be made of materials sold under the trademarks made of standard dielectric materials (e.g., Teflon and Rexolite) and having a rectangular cross-section may be used in place of the solid sample bars shown in FIG. 2. Each of these compartments accommodates an equal portion of the sample and is equipped with inlet and outlet holes (not shown) for introducing liquids into the compartments. By knowing the dielectric permittivity and the wall thickness (in the direction of propagation 82) of the compartment, its effect may be removed from the measurement, and thus, the dielectric permittivity of the liquid derived. The filler and drainage holes (not shown) in the compartments also allow the insertion of a temperature probe (not shown).

The measurement technique for solid samples may be readily extended to liquid samples. In this case liquid compartments are placed parallel to each planar surface of strip 20. A transmitted wave must now pass through the container's walls, one wall before entering the sample and one after leaving it as indicated in FIG. 8. End walls 83 and 84 of compartment 80 are away from the stripline so that they do not interfere with wave propagation.

In FIG. 9A, $\mu_1$ and $\epsilon_1$ are the magnetic permeability and dielectric permittivity, respectively, of the walls of the liquid container. These values can be measured using the dry sample theory where a sample made of the same material as the liquid container is measured in the stripline sample accommodator. The permeability and permittivity of the liquid sample are denoted by $\mu_2$ and $\epsilon_{c2}$, respectively.

FIG. 9B is the equivalent transmission line model of FIG. 9A. The values $k_1$ and $Z_1$ are the propagation constant and characteristic impedance of the wall portion of the sample accommodator. They can be obtained from dielectric measurements of the wall material.

As the impedances and propagation constants may be expressed as follows:

$$Z_1 = \frac{\sqrt{\mu_1 \epsilon_0}}{\sqrt{\epsilon_{c1}}} \frac{83,988}{\frac{(w/b)}{1-(t/b)} + \left(\frac{C_f \epsilon_0}{0.0885 \epsilon_{r1}}\right)} \quad (49)$$

$$k_1 = \omega \sqrt{\mu_1 \epsilon_{c1}} \quad (50)$$

$$Z_2 = \frac{\sqrt{\mu_2 \epsilon_0}}{\sqrt{\epsilon_{c2}}} \frac{83,988}{\frac{(w/b)}{1-(t/b)} + \frac{C_f \epsilon_0}{0.0885 \epsilon_{r2}}} \quad (51)$$

$$k_2 = \omega \sqrt{\mu_2 \epsilon_{c2}} \quad (52)$$

where:
b=the distance between ground plates;
w=the width of strip 20;
t=thickness of strip 20;
$\epsilon_{c1}$=the permittivity of the liquid container;
$\mu_1$=the permeability of the liquid container;
$\epsilon_{c2}$=the permittivity of the liquid sample;
$\mu_2$=the permeability of the liquid sample;
$\omega$=the angular frequency of the wave; and
$C_f$ is the fringe capacitance given by $$C_f = \frac{0.0885 \epsilon}{\pi} \left\{ \frac{2}{1-(t/b)} \ln\left(\frac{1}{1-(t/b)} + 1\right) - \left(\frac{1}{1-(t/b)} - 1\right) \ln\left(\frac{1}{[1-(t/b)]^2} - 1\right) \right\} \quad (53)$$

in picofarads/cm where $\epsilon$ is $\epsilon_{r1}$ for the $Z_1$ portion and $\epsilon_{r2}$ for the $Z_2$ portion.

The line is divided into five regions and W==d is taken as a reference point where the incident wave (which is assumed to have an amplitude of 1) has a phase of zero as in FIG. 9. W is the distance from the boundary of at which an incident wave enters a liquid sample in the direction of propagation (as shown by arrow 82 in FIG. 8). If d is the wall thickness of liquid container 80 and l is the length of the liquid sample in the direction of propagation, then the voltages and currents in the five regions may be written as follows:

Region 1: $W \leq -d$ $$V_0(W) = e^{-jk_0(W+d)} + S_{11}e^{jk_0(W+d)} \quad (54)$$

$$I_0(W) = \frac{1}{Z_0}[e^{-jk_0(W+d)} - S_{11}e^{jk_0(W+d)}] \quad (55)$$

Region 2: $-d \leq W \leq 0$ $$V_1(W) = Ae^{-jk_1 W} + Be^{jk_1 W} \quad (56)$$

$$I_1(W) = \frac{1}{Z_1}[Ae^{-jk_1 W} - Be^{jk_1 W}] \quad (57)$$

Region 3: $0 \leq W \leq l$ $$V_2(W) = Ce^{-jk_2 W} + De^{jk_2 W} \quad (58)$$

$$I_2(W) = \frac{1}{Z_2}[Ce^{-jk_2 W} - De^{jk_2 W}] \quad (59)$$

Region 4: $l \leq W \leq l+d$ $$V_3(W) = Ee^{-jk_1 W} + Fe^{jk_1 W} \quad (60)$$

$$I_3(W) = \frac{1}{Z_1}[Ee^{-jk_1 W} - Fe^{jk_1 W}] \quad (61)$$

Region 5: $l + d \leq W$ $$V_4(W) = S_{21}e^{-jk_0(W-l-d)} \quad (62)$$

$$I_4(W) = \frac{1}{Z_0}[S_{21}e^{-jk_0(W-l-d)}] \quad (63)$$

where A through F are constant coefficients and $S_{21}$ and $S_{11}$ are measured scattering parameters.

At each interface, the boundary conditions consisting of continuity in the phase and amplitude of the voltages and currents must be satisfied. Consequently, at W=−d we have $$V_0(-d) = V_1(-d) \quad (64)$$

$$I_0(-d) = I_1(-d) \quad (65)$$

From Equations (54) and (57)

$$1 + S_{11} = Ae^{jk_1 d} + Be^{-jk_1 d} \quad (66)$$

$$\frac{1 - S_{11}}{Z_0} = \frac{Ae^{jk_1 d} - Be^{-jk_1 d}}{Z_1} \quad (67)$$

Solving these equations for A and B gives us $$A = \tfrac{1}{2}e^{-jk_1 d}\left[(1 + S_{11}) + (1 - S_{11})\frac{Z_1}{Z_0}\right] \quad (68)$$

$$B = \tfrac{1}{2}e^{jk_1 d}\left[(1 + S_{11}) - (1 - S_{11})\frac{Z_1}{Z_0}\right] \quad (69)$$

Similarly, at the point W=l+d, we have $$E = \tfrac{1}{2}e^{jk_1(l+d)} S_{21}\left(1 + \frac{Z_1}{Z_0}\right) \quad (70)$$

$$F = \tfrac{1}{2}e^{-jk_1(l+d)} S_{21}\left(1 - \frac{Z_1}{Z_0}\right) \quad (71)$$

For $W = 0$ $$C = \tfrac{1}{2}\left[\left(1 + \frac{Z_2}{Z_1}\right)A + \left(1 - \frac{Z_2}{Z_1}\right)B\right] \quad (72)$$

$$D = \tfrac{1}{2}\left[\left(1 - \frac{Z_2}{Z_1}\right)A + \left(1 + \frac{Z_2}{Z_1}\right)B\right] \quad (73)$$

For $W = l$ we have $$C = \tfrac{1}{2}e^{jk_2 l}\left[\left(1 + \frac{Z_2}{Z_1}\right)Ee^{-jk_1 l} + \left(1 - \frac{Z_2}{Z_1}\right)Fe^{jk_1 l}\right] \quad (74)$$

$$D = \tfrac{1}{2}e^{-jk_2 l}\left[\left(1 - \frac{Z_2}{Z_1}\right)Ee^{-jk_1 l} + \left(1 + \frac{Z_2}{Z_1}\right)Fe^{jk_1 l}\right] \quad (75)$$

Now the product CD obtained from Equations (72) and (73) must equal that obtained from Equations (74) and (75).

$$\left[\left(1+\frac{Z_2}{Z_1}\right)A + \right. \tag{76}$$

$$\left[\left(1-\frac{Z_2}{Z_1}\right)B\right]\left[\left(1-\frac{Z_2}{Z_1}\right)A + \left(1+\frac{Z_2}{Z_1}\right)B\right] =$$

$$\left[\left(1+\frac{Z_2}{Z_1}\right)Ee^{-jk_1 l} + \right.$$

$$\left(1-\frac{Z_2}{Z_1}\right)Fe^{jk_1 l}\right]\left[\left(1-\frac{Z_2}{Z_1}\right)Ee^{-jk_1 l} + \right.$$

$$\left. \left(1+\frac{Z_2}{Z_1}\right)Fe^{jk_1 l}\right]$$

We can simplify this equation by letting $X = Z_2/Z_1$ $G = Ee^{-jkl}$ $H = Fe^{jkl}$ Thus Equation (76) becomes $$([1+X)A+(1-X)B][(1-X)A+(1+X)B] = ([(1+X)G+(1-X)H][(1-X)G+(1+X)H] \tag{77}$$

After some rearrangement of this expression we have:

$$[(G-H)^2 - (A-B)^2]X^2 = (G+H)^2 - (A+B)^2 \tag{78}$$

Consequently, $$X = \frac{Z_2}{Z_1} = \left[\frac{(A+B)^2 - (G+H)^2}{(A-B)^2 - (G-H)^2}\right]^{\frac{1}{2}} \tag{79}$$

since the right hand sides of Equations 72 and 74 must be equal, we can write $$q = e^{-jk_2 l} = \frac{(1+X)G + (1-X)H}{(1+X)A + (1-X)B} \tag{80}$$

The quantities A, B, G, H, and X are known, so q is known. The propagation constant of the strip transmission line filled with liquid is:

$$k_2 = \omega \sqrt{\mu_2 \epsilon_{c2}} = \frac{j \ln (q)}{l} \tag{81}$$

so $$\sqrt{\mu_2 \epsilon_{c2}} = \frac{j \ln (q)}{\omega l} \tag{82}$$

Recalling that in air the characteristic impedance for a stripline transmission line is given by $$Z_0 = \sqrt{\mu_0} \frac{83.988}{\frac{w/b}{1-(t/b)} + \frac{C_f}{0.0885}} \tag{83}$$

and combining this with Equation (51) leads to $$\frac{Z_0}{Z_2} = \sqrt{\frac{\epsilon_{c2}}{\mu_2}} \sqrt{\frac{\mu_0}{\epsilon_0}} \tag{84}$$

thus $$\sqrt{\frac{\epsilon_{c2}}{\mu_2}} = \frac{Z_0}{Z_2} \sqrt{\frac{\epsilon_0}{\mu_0}} \tag{85}$$

Combining Equation (82) with Equation (85) gives $$\epsilon_{c2} = \frac{j \ln (q)}{\omega l} \frac{Z_0}{Z_2} \sqrt{\frac{\epsilon_0}{\mu_0}}. \tag{86}$$

From the basic definition of complex permittivity given in Equation (9), the dielectric constant and conductivity for any liquid can be obtained from Equation (86) as follows:

$$\epsilon_{r2} = \frac{1}{\sqrt{\mu_0 \epsilon_0}} \frac{1}{\omega l} Re\left[j \ln (q) \frac{Z_0}{Z_2}\right] \tag{87}$$

$$\sigma_2 = -\sqrt{\frac{\epsilon_0}{\mu_0}} \frac{1}{l} Im\left[j \ln (q) \frac{Z_0}{Z_2}\right] \tag{88}$$

FIG. 10 shows data on Berea sandstones, saturated with distilled water and with brines of various salinities. These data are in good agreement with published results. The critical sample dimension is the x-dimension shown in FIG. 2. As indicated in Equation (44), the calculated permittivity is inversely proportional to this dimension. However, this dimension can be machined and measured precisely enough so that it is not a significant source of error.

Based on the above considerations, and also on experience with measurements of standard solids and liquids, it is believed that the accuracy in the measurement of the complex permittivity for a prototype sample accommodator is typically ±5% in the range 20–1300 MHz, degrading to ±10% for very lossy samples (e.g. strong brines and some alcohols). It is believed here is room for further improvement in the design (e.g. the transition), leading to even higher accuracies over broader bands.

While the present invention has been described in terms of a preferred embodiment, further modifications and improvements will occur to those skilled in the art. For example, sample compartments, the apparatus according to the present invention, may be modified to measure the dielectric constant of a flowing fluid.

In FIG. 11, sections of pipe segments 110 and 111 (not shown) are rectangular cross-section similar to containers 80 and 81. Each of segments 110 and 111 is connected to an in-line mixer 113 by way of small diameter pipes 112. In-line mixer 113 has an input connected to a feed line 114 which may be connected to a source of a flowing fluid. A return line is connected to an end of each of segments 110 and 111 which end is directly opposite to the end connected to lines 112. By connecting transitions 270 and 290, as described for the embodiment of the present invention having sample containers 80 and 81, the complex dielectric constant of the flowing fluid may be continually monitored. Such apparatus may be used, for example, to monitor salinity of a flowing brine (such as produced water) or to measure the water/oil fraction in a small diameter pipeline.

I desire it to be understood, therefore, that the present invention is not limited to the particular form shown and that I intend in the appended claims to cover all such equivalent variations which come within the scope of the invention as claimed.

What is claimed is:

1. Stripline apparatus for the measurement of scattering parameters of a core sample comprising:
   (a) a sample holder comprising:
      a single conductive strip having two planar surfaces; and
      two ground planes, each of said ground planes being positioned opposite to and parallel to a different one of said planar surfaces of said strip, wherein said holder has a characteristic impedance unchanging along its length when said holder is empty of samples;
   (b) means for containing the core sample in two portions between each of said ground planes and said surface opposite to it, said sample portions having a z dimension large enough so that the main electric field and the fringing electric field from said conductive strip are substantially contained within the portions;
   (c) means for measuring amplitudes and phase shifts of the signals reflected from and transmitted through the core sample.

2. Apparatus as recited in claim 1 wherein said means for containing comprises two endplates, each of said endplates being connected to each ground plane and being electrically isolated from said strip.

3. Apparatus as recited in claim 2 wherein said means for containing further comprises two coaxial cable connectors, each coaxial cable connector being connected to different end of said strip.

4. Apparatus as recited in claim 3 wherein each end of said strip is fluted.

5. Apparatus as recited in claim 2 wherein said means for containing further comprises two compartments, each of said compartments being positioned between a different surface of said strip and one of said ground planes.

6. Apparatus as recited in claim 5 wherein said means for containing further comprises two coaxial cable connectors, each coaxial cable connector being connected to different end of said strip.

7. Apparatus as recited in claim 6 wherein each end of said strip is fluted.

8. Apparatus as recited in claim 7 wherein said means for containing further comprises two pipe segments compartments, each of said pipe segments being positioned between a different surface of said strip and one of aid ground planes.

9. Apparatus as recited in claim 8 wherein said means for containing further comprises two coaxial cable connectors, each coaxial cable connectors being connected to different end of said strip.

10. Apparatus as recited in claim 9 wherein each end of said strip is fluted.

11. A method for measuring scattering parameters of core samples comprising the steps of:
    (a) placing each of two core sample portions between a different planar surface of a conductive strip and one of two ground planes, wherein said conductive strip and two ground planes form a sample holder having a characteristic impedance unchanging along its length when said sample holder is empty of samples, said core samples having dimensions large enough so that the main electric field and the fringing fields from said conducive strip are contained within said core sample portions; and
    (b) calculating the amplitude and phase shift parameters of said core sample portions in the frequency domain based on reflected and transmitted signal data from the samples.

12. The method as recited in claim 11 wherein said placing step comprises the step of introducing each core sample portion in the form of a block of rectangular cross-section between a different planar surface of the conductive strip and one of the two ground planes.

13. The method as recited in claim 11 wherein said placing step comprises the step of introducing each core sample portion in liquid form into one of two compartments, each compartment being located between a different planar surface of the conductive strip and one of the two ground planes.

* * * * *